United States Patent [19]
Chiozzi et al.

[11] Patent Number: 5,952,881
[45] Date of Patent: Sep. 14, 1999

[54] POWER STAGE, PARTICULARLY FOR AN OPERATIONAL AMPLIFIER

[75] Inventors: Giorgio Chiozzi, Cinisello Balsamo; Sandro Storti, Sesto San Giovanni; Claudio Tavazzani, Pavia, all of Italy

[73] Assignee: SGS-Thomson Microelectronics S.r.l., Agrate Brianza, Italy

[21] Appl. No.: 08/839,231

[22] Filed: Apr. 24, 1997

[30] Foreign Application Priority Data

Apr. 26, 1996 [EP] European Pat. Off. .............. 96830235

[51] Int. Cl.⁶ ...................................................... H03F 3/26
[52] U.S. Cl. ........................ 330/255; 330/273; 330/274
[58] Field of Search .................................. 330/255, 262, 330/270, 273, 274

[56] References Cited

U.S. PATENT DOCUMENTS

| | | | |
|---|---|---|---|
| 3,903,479 | 9/1975 | Limberg | 330/22 |
| 4,078,207 | 3/1978 | Leidich | 330/273 |
| 4,295,101 | 10/1981 | Leidich | 330/262 |
| 5,019,789 | 5/1991 | Graeme et al. | 330/273 |

FOREIGN PATENT DOCUMENTS

A-39 20 802  1/1991  Germany .

*Primary Examiner*—Steven J. Mottola
*Attorney, Agent, or Firm*—Wolf, Greenfield & Sacks, P.C.

[57] ABSTRACT

A power stage for an operational amplifier includes an output stage, a current source stage, and a gain stage. The output stage is formed by first and second NPN output transistors arranged in a Totem-Pole configuration, each having respective resistors connected between their respective base and emitter terminals. The output transistors are biased in class AB by a quiescent current supplied by the current source stage and are controlled dynamically by the gain stage. The gain stage includes an NPN gain transistor having a collector terminal connected to the base terminal of the first output transistor and an emitter terminal connected to the base terminal of the second output transistor.

33 Claims, 2 Drawing Sheets

POWER STAGE, PARTICULARLY FOR AN OPERATIONAL AMPLIFIER

BACKGROUND OF THE INVENTION

1. Field of the Invention

The present invention relates to a power stage, and in particular, to a power stage for an operational amplifier.

2. Discussion of the Related Art

As is known, a wide variety of power stages exist for operational amplifiers featuring NPN power output transistors, and which are classified according to the type of biasing employed. In the following description, reference will be made to a class AB amplifier, in which, even when in a quiescent condition, the transistors are supplied with a weak current to eliminate crossover distortion.

Accurate control of the quiescent current is especially important in the case of class AB amplifiers, and is normally done using complex circuit networks including numerous NPN and PNP components. However, such complex circuit networks involve several drawbacks. For example, the control network introduces numerous poles, which impair the operational amplifier band, involves a far from negligible increase in the area required for integrating the operational amplifier, and is not always capable of accurately controlling and reproducing the quiescent current.

In addition, power stages of this type are also unstable when a capacitive load is connected to the output; this instability is eliminated by providing a network (known as a Boucherot cell) comprising the series connection of a resistor with a very low resistance (a few Ω), and a capacitor with a capacitance in the order of hundreds of nF and located between the output of the operational amplifier and ground. Such a cell, however, presents the drawback of increasing the cost of the amplifier.

SUMMARY OF THE INVENTION

It is an object of the present invention to provide an amplifier stage designed to overcome the aforementioned drawbacks.

According to an embodiment of the present invention, a power stage for an operational amplifier includes an output stage operating in class AB having an output terminal, and including a top transistor element and a bottom transistor element. The top transistor element has a first terminal connected to the output terminal, a second terminal connected to a first reference potential line, and a control terminal. The bottom transistor element has a first terminal connected to a second reference potential line, a second terminal connected to the output terminal, and a control terminal. A first resistive element is connected between the control terminal and the first terminal of the top transistor element, and a second resistive element is connected between the control terminal and the first terminal of the bottom transistor element.

According to another embodiment of the present invention, the power stage includes a gain stage and a current source stage. The gain stage is connected between the control terminals of the top and bottom transistor elements of the output stage, and the current source stage is connected to the control terminal of the top transistor element of the output stage. According to a further embodiment, the gain stage includes a gain transistor element having a first terminal that is connected to the control terminal of the top transistor element, and a second terminal connected to the control terminal of the bottom transistor element. According to a still further embodiment of the present invention, the top and bottom transistor elements of the output stage and the gain transistor element of the gain stage include NPN transistors.

According to another embodiment of the present invention, the top transistor element and the bottom transistor element include Darlington transistors. In a further embodiment of the present invention, the top transistor element includes first and second transistors and the bottom transistor element includes third and fourth transistors, each of the transistors having first and second terminals and a control terminal. The control terminals of the first and third transistors respectively define the control terminals of the top and bottom transistor elements, and the first terminals of the second and fourth transistors respectively define the first terminals of the top and bottom transistor elements. Furthermore, the first resistive element includes first and second resistors and the second resistive element includes third and fourth resistors. The first resistor is connected between the control terminal of the first transistor and the first terminal of the second transistor, and the second resistor is connected between the control terminal of the second transistor and the first terminal of the second transistor. The third resistor is connected between the control terminal of the third transistor and the first terminal of the fourth transistor, and the fourth resistor is connected between the control terminal of the fourth transistor and the first terminal of the fourth transistor.

According to a further embodiment of the present invention, the gain transistor element of the gain stage includes a fifth and a sixth transistor connected in a Darlington configuration. According to another embodiment of the present invention, the first terminal of the top and bottom transistor elements is an emitter terminal, the second terminal is a collector terminal, and the control terminal is a base terminal.

BRIEF DESCRIPTION OF THE DRAWINGS

Preferred, non-limiting embodiments of the present invention will be described by way of example with reference to the accompanying drawings, in which.

DETAILED DESCRIPTION

Figure 1:
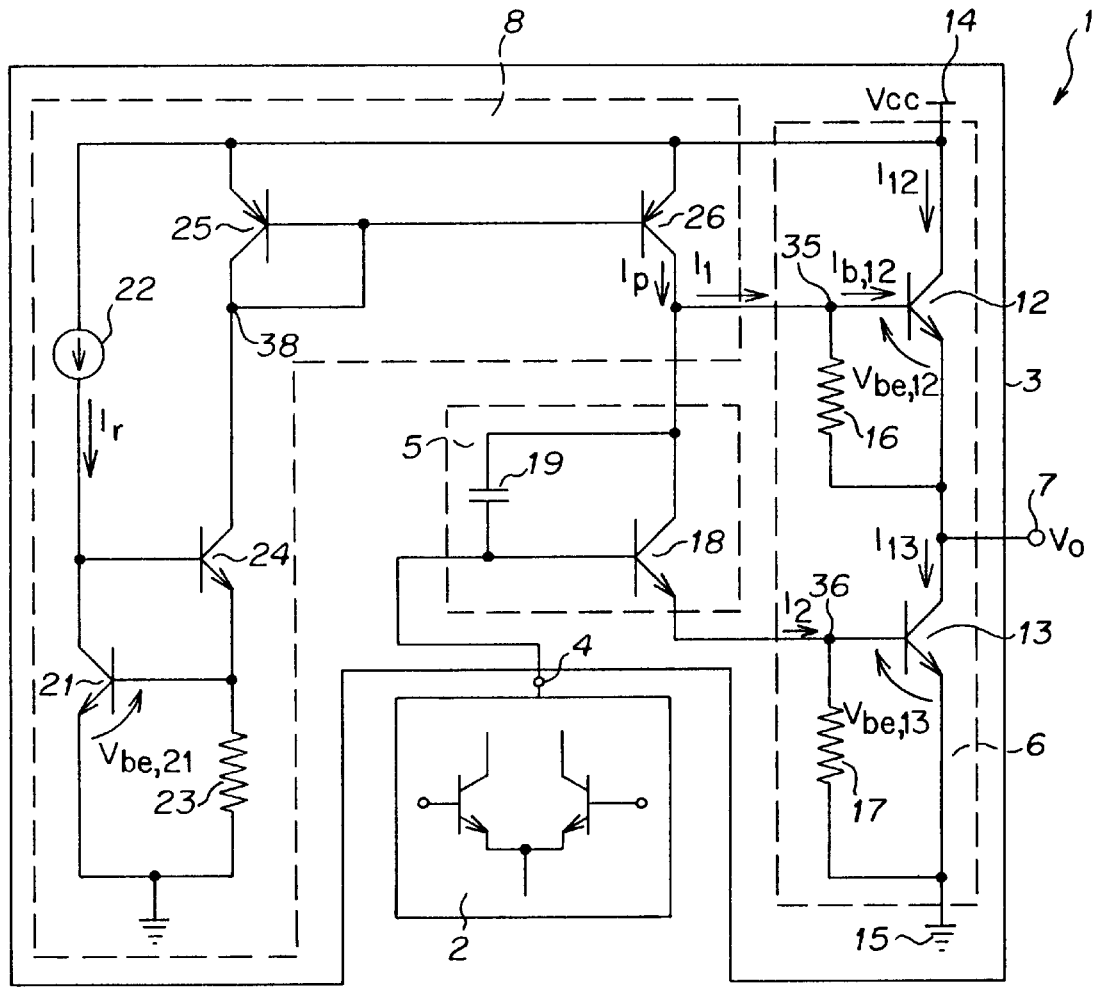
FIG. 1 shows a circuit diagram of a power stage according to a first embodiment of the present invention.

Number 1 in FIG. 1 indicates an operational amplifier including a differential input stage 2, shown only schematically and not described in detail, and a power stage 3 connected to the output 4 of the differential input stage 2. Power stage 3, in turn, includes a gain stage 5, a power output stage 6 connected to gain stage 5 and defining an output terminal 7 supplying an output signal $V_o$, and a current source stage 8 for biasing output stage 6.

Output stage 6 includes two NPN transistors 12, 13 in a Totem-Pole configuration. Transistor 12 has an emitter terminal connected to output terminal 7, a base terminal defining a node 35, and a collector terminal connected to a supply line 14 (at supply voltage $V_{cc}$). Transistor 13 has an emitter terminal connected to a ground line 15, a base terminal defining a node 36, and a collector terminal connected to output terminal 7. Transistors 12, 13 occupy respective areas $A_{12}$, $A_{13}$, have respective inverted saturation currents $I_{s,12}$, $I_{s,13}$, have voltages $V_{be,12}$, $V_{be,13}$ between their respective base and emitter terminals, respectively, and are supplied with currents $I_{12}$, $I_{13}$, respectively. Output stage 6 also includes two resistors 16 and 17 having the same resistance R and located between the base and emitter terminals of transistors 12 and 13, respectively.

Gain stage 5 includes an NPN transistor 18 having a base terminal connected to output 4 of input stage 2, a collector terminal connected to the base terminal of transistor 12 (node 35), and an emitter terminal connected to the base terminal of transistor 13, and a stabilizing capacitor 19 located between the base and collector terminals of transistor 18.

Current source stage 8 includes an NPN reference transistor 21 having an emitter terminal connected to ground line 15, a collector terminal connected to supply line 14 via an equivalent current source 22, and a base terminal connected to ground line 15 via a resistor 23 of resistance R/2, where R is the resistance of resistors 16 and 17, as indicated above. Reference transistor 21 has an area $A_{21}$ and a voltage drop $V_{be,21}$ between the base and emitter terminals, and equivalent current source 22 supplies a current $I_r$ to reference transistor 21. Transistor 24 has base and emitter terminals connected to the collector and base terminals of reference transistor 21, respectively, and a collector terminal defining a node 38. In addition, current source stage 8 includes two PNP transistors 25, 26 arranged so as to form a current mirror. More specifically, transistors 25, 26 have base terminals connected to each other, and their emitter terminals connected to supply line 14. Transistor 25 has its collector and base terminals connected to each other and to node 38, and transistor 26 has its collector terminal connected to node 35 of output stage 6 to which it supplies a bias current $I_p$ proportional to current $I_r$ that is supplied by equivalent current source 22.

Operation of the output stage will be described with reference firstly to the quiescent condition in which no signal is present at the input of the operational amplifier, and disregarding, for the moment, the base currents of the circuit transistors.

All of current $I_R$ generated by equivalent source 22 flows into reference transistor 21 to produce a voltage drop $V_{be,21}$, which in turn produces, in resistor 23 of resistance R/2, a current $2V_{be,21}/R$, which is mirrored by current mirror 25, 26 and supplied to node 35 as current $I_p$. In the quiescent condition, current $I_p$ is divided so that currents $I_{12}$ and $I_{13}$ supplied by transistors 12 and 13 of output stage 6 are equal. In the event transistors 12 and 13 are identical (i.e. $A_{12}=A_{13}$ and $I_{s,12}=I_{s,13}$), currents $I_1$ and $I_2$ supplied to transistors 12 and 13 equal $V_{be,21}/R$. In this case, voltages $V_{be,12}$ and $V_{be,13}$ between the base and emitter terminals of transistors 12 and 13 are equal to each other and to $V_{be,21}$. Since the quiescent performance of transistor 13 is identical to that of transistor 12, reference will be made in the following description solely to the quantities relative to transistor 12 for the sake of simplicity.

In the circuit of FIG. 1, the quiescent current $I_{12}$ in transistor 12 is given by the equation:

$$I_{12} = I_{s,12} \cdot \exp\frac{V_{be,12}}{V_t} = I_{s,12} \cdot \exp\frac{R \cdot \frac{I_p}{2}}{V_t} \quad (1)$$

where $V_t$ is the thermal voltage.

The current $I_r$ in reference transistor 21 equals:

$$I_r = I_{s,21} \exp\left(\frac{V_{be,21}}{V_t}\right) \quad (2)$$

where $I_{s,21}$ is the saturation current of reference transistor 21, so that:

$$V_{be,21} = V_t \ln\left(\frac{I_r}{I_{s,21}}\right) \quad (3)$$

and, since, as stated, $I_p = 2V_{be,21}/R$:

$$I_p = 2 \cdot \frac{V_t}{R} \cdot \ln\left(\frac{I_r}{I_{s,21}}\right) \quad (4)$$

Substituting (4) in (1) gives:

$$I_{12} = I_{s,12} \cdot \frac{I_r}{I_{s,21}}$$

and, since the saturation current of a transistor is directly proportional to the area occupied, this gives:

$$I_{12} = I_r \cdot \frac{A_{12}}{A_{21}} \quad (5)$$

Dynamic operation will now be described assuming transistor 12 supplies the maximum current. In this condition, all of current $I_p = 2V_{be,21}/R$ flows into the branch comprising transistor 12, and from there partly through resistor 16 and partly into transistor 12 via the base terminal.

As compared to the quiescent condition, voltage drop $V_{be,12}$ between the base and emitter of transistor 12 is increased by:

$$\delta V_{be,12} = V_{be,12,\max} - V_{be,12} = V_t \cdot \ln\left(\frac{I_{12,\max}}{I_{12}}\right) \quad (6)$$

where $V_{be,12,max}$ is the voltage drop between the base and emitter of transistor 12 in the maximum current supply condition; and $I_{12,max}$ is the maximum current supplied by transistor 12.

The current component through resistor 16 and which causes the increase in $V_{be,12}$ is:

$$\delta I_r = \frac{\delta V_{be,12}}{R} = \frac{V_t}{R} \cdot \ln\left(\frac{I_{12,\max}}{I_{12}}\right) \quad (7)$$

The increase in current at the base of transistor 12, on the other hand, equals:

$$\delta I_{b,12} = \frac{I_{12,\max} - I_{12}}{\beta} \quad (8)$$

where $\beta$ is the current gain of transistor 12.

Given the maximum current $I_{12,max}$ to be supplied, resistance R of resistor 16 should be fairly low to ensure the excess current, with respect to the quiescent condition, is sufficient to supply the increase in current at the base of transistor and the increase in current in resistor 16 due to the increase in voltage between the base and emitter of transistor 12.

In practice, if $I_R$ is the current through resistor 16, the following equation applies:

$$\frac{V_{be,21}}{R} \geq \delta I_{b,12} + \delta I_R. \quad (9)$$

Substituting $\delta I_R$ and $\delta I_{b,12}$ resulting from equations (7) and (8) in (9), this gives:

$$R \leq \beta \frac{V_{be,21} - V_t \cdot \ln\left(\frac{I_{12,\max}}{I_{12}}\right)}{I_{12,\max} - I_{12}} \quad (10)$$

The same also applies if maximum current is supplied by transistor 13.

In calculating the quiescent current as shown above, no account has been taken of the base current $I_{b,12}$ of transistor 12, which introduces an error into quiescent current $I_{12}$ so that the actual current is less than the theoretical one calculated above. If the base current is also accounted for, and bearing in mind that $I_{b,12} = I_{12}/\beta$, where $I_{12}$ is the collector current of transistor 12, the voltage drop of resistor 16, which determines the base-emitter voltage drop of transistor 12, is less than reference voltage $V_{be,21}$ by a quantity equal to:

$$dV'_{be} = -\frac{I'_{12}}{\beta} \cdot R \quad (11)$$

where $I'_{12}$ is the nominal quiescent current of transistor 12 (and hence of transistor 13).

Taking into account the above variation in the voltage drop of resistor 16, quiescent current $I_{12,r}$ approximately equals:

$$I_{12,r} = I_{S,12} \exp\left(\frac{V_{be,12} + \delta V'_{be,12}}{V_t}\right) = I_{S,12} \exp\frac{V_{be,12}}{V_t} \cdot \exp\frac{\delta V'_{be,12}}{V_t} = \quad (12)$$

$$I'_{12} \cdot \exp\left(\frac{\delta V_{be,12}}{V_t}\right) = I'_{12} \cdot \exp\left(\frac{I'_{12} \cdot R}{\beta \cdot V_t}\right)$$

As can be seen, resistance R affects the quiescent current via the base current, and, by establishing the maximum permissible error via the ratio between the actual and nominal quiescent currents $I_{12,r}/I'_{12}$, the maximum R value may be calculated as follows:

$$R \leq \frac{\beta \cdot V_t}{I'_{12}} \cdot \ln\left(\frac{I_{12,r}}{I'_{12}}\right) \quad (13)$$

Figure 2:
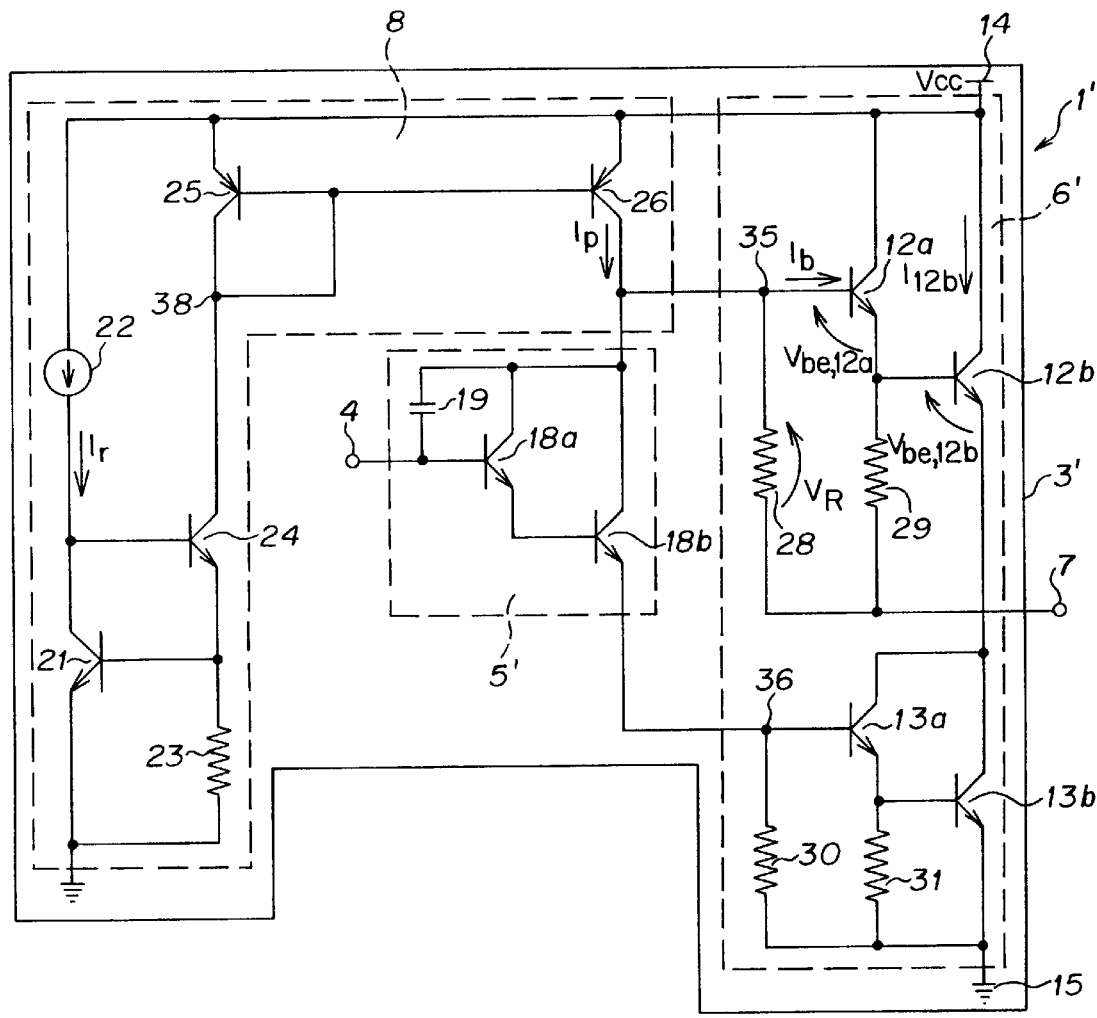
FIG. 2 shows a circuit diagram of a power stage according to a second embodiment of the present invention.

In the embodiment of FIG. 2, the power stage, in this case indicated 3', includes a gain stage 5', which differs from gain stage 5 by presenting, as opposed to transistor 18, a first pair of transistors 18a, 18b in Darlington configuration. Power stage 3' also includes an output stage 6', which differs from output stage 6 by presenting, instead of transistors 12 and 13, a second pair of transistors 12a, 12b and a third pair of transistors 13a, 13b also in Darlington configuration.

Transistors 12a, 12b, 13a, 13b of output stage 6' respectively present base-emitter voltages $V_{be,12a}$, $V_{be,12b}$, $V_{be,13a}$, $V_{be,13b}$; saturation currents $I_{s,12a}$, $I_{12b}$, $I_{s,13a}$, $I_{s,13b}$; and areas $A_{12a}$, $A_{12b}$, $A_{13a}$, $A_{13b}$.

Output stage 6' also differs from output stage 6 by presenting, instead of resistors 16 and 17, resistors 28 and 29 and resistors 30 and 31, respectively. Resistor 28 is located between the base terminal of transistor 12a and the emitter terminal of transistor 12b, and resistor 29 is located between the base and emitter terminals of transistor 12b. Similarly, resistor 30 is located between the base terminal of transistor 13a and the emitter terminal of transistor 13b, and resistor 31 is located between the base and emitter terminals of transistor 13b. Resistors 28, 29, 30 and 31 all have the same resistance value $R_1$.

Bias current $I_p$ supplied by current source stage 8, in which resistor 23 now has a resistance value of R/4, equals:

$$I_{pl} = \frac{4 \cdot V_t}{R_1} \cdot \ln\left(\frac{I_r}{I_{s,21}}\right) \quad (14)$$

Disregarding the base currents of transistors 12a and 13a, and assuming the bias current, in the quiescent condition, is divided equally between transistors 12a, 12b and 13a, 13b, as described with reference to FIG. 1, the voltage drop of identical resistors 28, 30 equals:

$$V_R = 2 \cdot V_t \cdot \ln\left(\frac{I_r}{I_{s,21}}\right). \quad (15)$$

The base-emitter voltage drop of transistor 12b (or transistor 13b, assumed identical to transistor 12b) equals:

$$V_{be,12b} = V_R - V_{be,12a} = \quad (16)$$

$$2 \cdot V_t \cdot \ln\left(\frac{I_r}{I_{s,21}}\right) - V_t \cdot \ln\left(\frac{V_{be,12b}}{I_{s,12a} \cdot R_1}\right) = V_t \cdot \ln\left[\left(\frac{I_r}{I_{s,21}}\right)^2 \frac{I_{s,12a} \cdot R_1}{V_{be,12a}}\right]$$

so that the quiescent current equals:

$$I_{12b} = \frac{I_{s,12b} \cdot I_{s,12a}}{\frac{V_{be,12b}}{R_1}} \cdot \frac{I_r^2}{I_{s,21}^2} = \frac{A_{12b} \cdot A_{12a}}{A_{21}^2} \cdot \frac{I_r^2}{\frac{V_{be,12b}}{R_1}} \quad (17)$$

In this case also, as shown clearly in equation (17), the quiescent current value may be regulated by working on the resistance value.

The advantages of the power stage according to embodiments of the present invention are as follows. The quiescent currents are controlled by simply providing additional resistive elements in the output stage, i.e. with no need for complex circuit networks, so that the circuit is simple in design, easy to integrate, reliable by virtue of its parameters being accurately controllable, and presents a small area. The power stage so formed includes exclusively NPN power transistors, which are superior to PNP transistors with regard to frequency response and size, presents no local feedback loops, can withstand capacitive loads of up to a few tens of nF with no need for a Boucherot cell, and presents a wide band.

The topology of the power stage described is similar to that of Totem-Pole TTL devices, which, however, operate in class C with digital logic. Conversely, the stage according to the invention provides for class AB biasing, and may be used in low-distortion analog applications.

Clearly, changes may be made to the power stage as described and illustrated herein without, however, departing from the scope of the present invention. In particular, the above sizings may be modified to suit specific requirements, and any of the components may be replaced by technical equivalents.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A power stage for an operational amplifier, comprising:
an output stage operating in class AB, having an output terminal, and including a top transistor element and a bottom transistor element, said top transistor element having a first terminal, a second terminal connected to a first reference potential line, and a control terminal, and said bottom transistor element having a first terminal directly electrically connected to a second reference potential line, a second terminal connected to said first terminal of said top transistor element, and a control terminal;
said output terminal being directly electrically connected to said connection between said first terminal of said top transistor element and said second terminal of said bottom transistor element;
wherein a first resistive element is connected between said control terminal and said first terminal of said top transistor element; and
wherein a second resistive element is connected between said control terminal and said first terminal of said bottom transistor element.

2. The power stage of claim 1, further comprising:
a gain stage connected between said control terminals of said top and bottom transistor elements of said output stage; and
a current source stage connected to said control terminal of said top transistor element of said output stage.

3. The power stage of claim 2, wherein said gain stage includes a gain transistor element having a first terminal connected to said control terminal of said top transistor element, and a second terminal connected to said control terminal of said bottom transistor element.

4. The power stage of claim 1, wherein said top transistor element and said bottom transistor element include Darlington transistors.

5. The power stage of claim 4, wherein:
said top transistor element includes first and second transistors and said bottom transistor element includes third and fourth transistors, each of said transistors having first and second terminals and a control terminal, said control terminals of said first and third transistors respectively defining said control terminals of said top and bottom transistor elements, and said first terminals of said second and fourth transistors respectively defining said first terminals of said top and bottom transistor elements; and
wherein said first resistive element includes first and second resistors and said second resistive element includes third and fourth resistors, said first resistor being connected between said control terminal of said first transistor and said first terminal of said second transistor, said second resistor being connected between said control terminal of said second transistor and said first terminal of said second transistor, said third resistor being connected between said control terminal of said third transistor and said first terminal of said fourth transistor, and said fourth resistor being connected between said control terminal of said fourth transistor and said first terminal of said fourth transistor.

6. A power stage for an operational amplifier, comprising:
an output stage operating in class AB, having an output terminal, and including a top transistor element and a bottom transistor element, said top transistor element having a first terminal connected to said output terminal, a second terminal connected to a first reference potential line, and a control terminal, and said bottom transistor element having a first terminal connected to a second reference potential line, a second terminal connected to said output terminal, and a control terminal;
wherein a first resistive element is connected between said control terminal and said first terminal of said top transistor element;
wherein a second resistive element is connected between said control terminal and said first terminal of said bottom transistor element;
a gain stage connected between said control terminals of said top and bottom transistor elements of said output stage;
a current source stage connected to said control terminal of said top transistor element of said output stage;
wherein said top transistor element and said bottom transistor element include Darlington transistors; and
wherein said gain stage has a gain transistor element that includes a fifth and a sixth transistor in a Darlington configuration.

7. The power stage of claim 3, wherein said top and bottom transistor elements of said output stage and said gain transistor element of said gain stage include NPN transistors.

8. The power stage of claim 1, wherein said first terminal of said top and bottom transistor elements is an emitter terminal, said second terminal is a collector terminal, and said control terminal is a base terminal.

9. A power stage for an operational amplifier, comprising:
an output stage operating in class AB, having an output terminal, and including a top transistor element and a bottom transistor element, said top transistor element having a first terminal connected to said output terminal, a second terminal connected to a first reference potential line, and a control terminal, and said bottom transistor element having a first terminal connected to a second reference potential line, a second terminal connected to said output terminal, and a control terminal;
wherein a first resistive element is connected between said control terminal and said first terminal of said top transistor element;
wherein a second resistive element is connected between said control terminal and said first terminal of said bottom transistor element;
a gain stage connected between said control terminals of said top and bottom transistor elements of said output stage;
a current source stage connected to said control terminal of said top transistor element of said output stage;
wherein said top transistor element and said bottom transistor element include Darlington transistors;
wherein said top transistor element includes first and second transistors and said bottom transistor element includes third and fourth transistors, each of said transistors having first and second terminals and a control terminal, said control terminals of said first and third transistors respectively defining said control terminals of said top and bottom transistor elements, and said first terminals of said second and fourth transistors respectively defining said first terminals of said top and bottom transistor elements;

wherein said first resistive element includes first and second resistors and said second resistive element includes third and fourth resistors, said first resistor being connected between said control terminal of said first transistor and said first terminal of said second transistor, said second resistor being connected between said control terminal of said second transistor and said first terminal of said second transistor, said third resistor being connected between said control terminal of said third transistor and said first terminal of said fourth transistor, and said fourth resistor being connected between said control terminal of said fourth transistor and said first terminal of said fourth transistor; and wherein said gain stage has a gain transistor element that includes a fifth and a sixth transistor in a Darlington configuration.

10. A power stage for an operational amplifier comprising:

an input stage having an input terminal to receive a differential input signal, a first output terminal, and a second output terminal; and a power output stage having a power output terminal and including first and second resistors and first and second transistors, the first and second transistors each having a first terminal, a second terminal, and a control terminal, the control terminal of the first and second transistors being electrically coupled to the first and second output terminals of the input stage, respectively;

wherein the first terminal of the first transistor is electrically coupled to a first reference potential terminal and the control terminal of the first transistor is electrically coupled to the second terminal of the first transistor through the first resistor;

wherein the first terminal of the second transistor is directly electrically connected to the second terminal of the first transistor, the second terminal of the second transistor is directly electrically connected to a second reference potential terminal, and the control terminal of the second transistor is electrically coupled to the second terminal of the second transistor through the second resistor; and said output terminal is directly electrically connected to said connection between said second terminal of said first transistor and said first terminal of said second transistor.

11. The power stage of claim 10, wherein the first and second transistors are NPN transistors and the first terminal of the first and second transistors is a collector terminal, the second terminal of the first and second transistors is an emitter terminal, and the control terminal of the first and second transistors is a base terminal.

12. The power stage of claim 10, wherein the input stage includes:

a gain stage connected between the first and second output terminals of the input stage, the gain stage including a third transistor having a first terminal that is connected to the first output terminal of the input stage, a second terminal that is connected to the second output terminal of the input stage, and a control terminal to receive the differential input signal.

13. A power stage for an operational amplifier comprising:

an input stage having an input terminal to receive a differential input signal, a first output terminal, and a second output terminal; and a power output stage having a power output terminal and including first and second resistors and first and second transistors, the first and second transistors each having a first terminal, a second terminal, and a control terminal, the control terminal of the first and second transistors being electrically coupled to the first and second output terminals of the input stage, respectively;

wherein the first terminal of the first transistor is electrically coupled to a first reference potential terminal, the second terminal of the first transistor is electrically coupled to the power output terminal, and the control terminal of the first transistor is electrically coupled to the second terminal of the first transistor through the first resistor;

wherein the first terminal of the second transistor is electrically coupled to the second terminal of the first transistor, the second terminal of the second transistor is electrically coupled to a second reference potential terminal, and the control terminal of the second transistor is electrically coupled to the second terminal of the second transistor through the second resistor: and wherein the input stage includes:

a gain stage connected between the first and second output terminals of the input stage, the gain stage including a third transistor having a first terminal that is connected to the first output terminal of the input stage, a second terminal that is connected to the second output terminal of the input stage, and a control terminal to receive the differential input signal; and a capacitor that is connected between the first terminal and the control terminal of the third transistor.

14. A power stage for an operational amplifier comprising:

an input stage having an input terminal to receive a differential input signal, a first output terminal, and a second output terminal; and a power output stage having a power output terminal and including first and second resistors and first and second transistors, the first and second transistors each having a first terminal, a second terminal, and a control terminal, the control terminal of the first and second transistors being electrically coupled to the first and second output terminals of the input stage, respectively;

wherein the first terminal of the first transistor is electrically coupled to a first reference potential terminal, the second terminal of the first transistor is electrically coupled to the power output terminal, and the control terminal of the first transistor is electrically coupled to the second terminal of the first transistor through the first resistor;

wherein the first terminal of the second transistor is electrically coupled to the second terminal of the first transistor, the second terminal of the second transistor is electrically coupled to a second reference potential terminal, and the control terminal of the second transistor is electrically coupled to the second terminal of the second transistor through the second resistor; and wherein the input stage includes:

a gain stage connected between the first and second output terminals of the input stage the gain stage including a third transistor having a first terminal that is connected to the first output terminal of the input stage, a second terminal that is connected to the second output terminal of the input stage, and a control terminal to receive the differential input signal; and a current source stage that is connected to the first output terminal of the input stage, the current source stage including:

a fourth transistor having a first terminal, a second terminal that is electrically coupled to the second reference potential terminal, and a control terminal;

a current source electrically coupled between the first reference potential terminal and the first terminal of the fourth transistor;

a third resistor that electrically couples the control terminal of the fourth transistor to the second reference potential terminal;

a fifth transistor having a first terminal, a second terminal that is electrically coupled to the control terminal of the fourth transistor and a control terminal that is electrically coupled to the first terminal of the fourth transistor; and a current mirror, electrically coupled between the first reference potential terminal and the first terminal of the fifth transistor, an output of the current mirror being connected to the first output terminal of the input stage.

15. The power stage of claim 14, wherein a resistance of the first resistor is approximately equal to a resistance of the second resistor, and the resistance of the first resistor is approximately twice a resistance of the third resistor.

16. A power stage for an operational amplifier comprising:

an input stage having an input terminal to receive a differential input signal, a first output terminal, and a second output terminal; and a power output stage having a power output terminal and including first and second resistors and first and second transistors, the first and second transistors each having a first terminal, a second terminal, and a control terminal, the control terminal of the first and second transistors being electrically coupled to the first and second output terminals of the input stage, respectively;

wherein the first terminal of the first transistor is electrically coupled to a first reference potential terminal, the second terminal of the first transistor is electrically coupled to the power output terminal, and the control terminal of the first transistor is electrically coupled to the second terminal of the first transistor through the first resistor;

wherein the first terminal of the second transistor is electrically coupled to the second terminal of the first transistor, the second terminal of the second transistor is electrically coupled to a second reference potential terminal, and the control terminal of the second transistor is electrically coupled to the second terminal of the second transistor through the second resistor;

wherein the input stage includes a current source stage connected to the first output terminal of the input stage, the current source stage including a third transistor having a first terminal, a second terminal that is electrically coupled to the second reference potential terminal, and a control terminal;

a current source electrically coupled between the first reference potential terminal and the first terminal of the third transistor;

a third resistor that electrically couples the control terminal of the third transistor to the second reference potential terminal;

a fourth transistor having a first terminal, a second terminal that is electrically coupled to the control terminal of the third transistor and a control terminal that is electrically coupled to the first terminal of the third transistor; and a current mirror, electrically coupled between the first reference potential terminal and the first terminal of the fourth transistor, an output of the current mirror being connected to the first output terminal of the input stage.

17. The power stage of claim 10, wherein the input stage includes:

a current source stage, connected to the first output terminal of the input stage, to provide a steady valued bias current to the power output stage; and a gain stage, connected between the first and second output terminals of the input stage, to adjust a proportion of the steady valued bias current that is provided to each of the first and second transistors based upon the differential input signal.

18. The power stage of claim 10, wherein the power output stage further includes:

a third transistor that electrically couples the control terminal of the first transistor to the first output terminal of the input stage, the third transistor having a first terminal that is electrically coupled to the first reference potential terminal, a second terminal that is connected to the control terminal of the first transistor, and a control terminal that is connected to the first output terminal of the input stage;

a fourth transistor that electrically couples the control terminal of the second transistor to the second output terminal of the input stage, the fourth transistor having a first terminal that is electrically coupled to the second terminal of the first transistor, a second terminal that is connected to the control terminal of the second transistor, and a control terminal that is connected to the second output terminal of the input stage;

a third resistor that electrically couples the control terminal of the third transistor to the second terminal of the first transistor; and a fourth resistor that electrically couples the control terminal of the fourth transistor to the second terminal of the second transistor.

19. The power stage of claim 18, wherein the first, second, third and fourth transistors are NPN transistors and the first terminal of the first, second, third and fourth transistors is a collector terminal, the second terminal of the first, second, third and fourth transistors is an emitter terminal, and the control terminal of the first, second, third and fourth transistors is a base terminal.

20. The power stage of claim 18, wherein the input stage includes:

a current source stage, connected to the first output terminal of the input stage, to provide a steady valued bias current to the power output stage; and a gain stage, connected between the first and second output terminals of the input stage, to adjust a proportion of the steady valued bias current that is provided to the third and first transistors and to the fourth and second transistors based upon the differential input signal.

21. A power stage for an operational amplifier comprising:
- an input stage having an input terminal to receive a differential input signal, a first output terminal, and a second output terminal; and
- a power output stage having a power output terminal and including first and second resistors and first and second transistors, the first and second transistors each having a first terminal, a second terminal, and a control terminal, the control terminal of the first and second transistors being electrically coupled to the first and second output terminals of the input stage, respectively;
- wherein the first terminal of the first transistor is electrically coupled to a first reference potential terminal, the second terminal of the first transistor is electrically coupled to the power output terminal, and the control terminal of the first transistor is electrically coupled to the second terminal of the first transistor through the first resistor;
- wherein the first terminal of the second transistor is electrically coupled to the second terminal of the first transistor, the second terminal of the second transistor is electrically coupled to a second reference potential terminal, and the control terminal of the second transistor is electrically coupled to the second terminal of the second transistor through the second resistor;
- wherein the power output stage further includes:
  - a third transistor that electrically couples the control terminal of the first transistor to the first output terminal of the input stage, the third transistor having a first terminal that is electrically coupled to the first reference potential terminal, a second terminal that is connected to the control terminal of the first transistor, and a control terminal that is connected to the first output terminal of the input stage;
  - a fourth transistor that electrically couples the control terminal of the second transistor to the second output terminal of the input stage, the fourth transistor having a first terminal that is electrically coupled to the second terminal of the first transistor, a second terminal that is connected to the control terminal of the second transistor, and a control terminal that is connected to the second output terminal of the input stage;
  - a third resistor that electrically couples the control terminal of the third transistor to the second terminal of the first transistor;
  - a fourth resistor that electrically couples the control terminal of the fourth transistor to the second terminal of the second transistor;
  - wherein the input stage includes:
    - a current source stage, connected to the first output terminal of the input stage, to provide a steady valued bias current to the power output stage;
    - a gain stage, connected between the first and second output terminals of the input stage, to adjust a proportion of the steady valued bias current that is provided to the third and first transistors and to the fourth and second transistors based upon the differential input signal; wherein the gain stage includes
      - a fifth transistor having a first terminal that is connected to the first output terminal of the input stage, a second terminal that is connected to the second output terminal of the input stage, and a control terminal; and
      - a sixth transistor having a first terminal that is connected to the first terminal of the fifth transistor, a second terminal that is connected to the control terminal of the fifth transistor, and a control terminal to receive the differential input signal.

22. A power stage for an operational amplifier comprising:
- an input stage having an input terminal to receive a differential input signal, a first output terminal, and a second output terminal; and
- a power output stage having a power output terminal and including first and second resistors and first and second transistors, the first and second transistors each having a first terminal, a second terminal, and a control terminal, the control terminal of the first and second transistors being electrically coupled to the first and second output terminals of the input stage, respectively;
- wherein the first terminal of the first transistor is electrically coupled to a first reference potential terminal, the second terminal of the first transistor is electrically coupled to the power output terminal, and the control terminal of the first transistor is electrically coupled to the second terminal of the first transistor through the first resistor;
- wherein the first terminal of the second transistor is electrically coupled to the second terminal of the first transistor, the second terminal of the second transistor is electrically coupled to a second reference potential terminal, and the control terminal of the second transistor is electrically coupled to the second terminal of the second transistor through the second resistor;
- wherein the power output stage further includes:
  - a third transistor that electrically couples the control terminal of the first transistor to the first output terminal of the input stage, the third transistor having a first terminal that is electrically coupled to the first reference potential terminal. a second terminal that is connected to the control terminal of the first transistor, and a control terminal that is connected to the first output terminal of the input stage;
  - a fourth transistor that electrically couples the control terminal of the second transistor to the second output terminal of the input stage, the fourth transistor having a first terminal that is electrically coupled to the second terminal of the first transistor, a second terminal that is connected to the control terminal of the second transistor, and a control terminal that is connected to the second output terminal of the input stage;
  - a third resistor that electrically couples the control terminal of the third transistor to the second terminal of the first transistor;
  - a fourth resistor that electrically couples the control terminal of the fourth transistor to the second terminal of the second transistor;
  - wherein the input stage includes:
    - a current source stage, connected to the first output terminal of the input stage, to provide a steady valued bias current to the power output stage; and
    - a gain stage, connected between the first and second output terminals of the input stage, to adjust a proportion of the steady valued bias current that is provided to the third and first transistors and to the fourth and second transistors based upon the differential input signal; and wherein the current source stage includes
a fifth transistor having a first terminal, a second terminal that is electrically coupled to the second reference potential terminal, and a control terminal;
a current source electrically coupled between the first reference potential terminal and the first terminal of the fifth transistor;
a fifth resistor that electrically couples the control terminal of the fifth transistor to the second reference potential terminal;
a sixth transistor having a first terminal, a second terminal that is electrically coupled to the control terminal of the fifth transistor and a control terminal that is electrically coupled to the first terminal of the fifth transistor; and
a current mirror, electrically coupled between the first reference potential terminal and the first terminal of the sixth transistor, an output of the current mirror being connected to the first output terminal of the input stage.

23. The power stage of claim 22, wherein a resistance of the first resistor is approximately equal to a resistance of the second, third, and fourth resistors, and the resistance of the first resistor is approximately four times a resistance of the fifth resistor.

24. An operational amplifier comprising:
a differential input stage to receive a first input signal and a second input signal and provide a differential output signal representing a difference between the first and second input signals;
a current source stage to provide a current having a steady value;
a gain stage, coupled to the current source stage and the differential input stage, to receive the current and adjust a proportion of the current that is provided to a first output and a second output based upon the differential output signal; and
a power output stage, coupled to the current source stage and the gain stage, to receive the proportion of current provided to the first and second outputs and generate a power amplified output signal based on the proportion of current provided to the first and second outputs;
said power output stage including a first and second amplifier connected in a push-pull configuration, said first amplifier including a first quiescent current setting element and said second amplifier including a second quiescent current setting element;
said first amplifier including a first transistor having a first terminal that is connected to a first reference potential terminal, a second terminal, and a control terminal that is connected to the first output;
said second amplifier including a second transistor having a first terminal that is connected to the second terminal of the first transistor, a second terminal that is directly electrically connected to a second reference potential terminal, and a control terminal that is connected to the second output;
said first quiescent current setting element including a first resistor that is directly electrically connected between the control terminal and the second terminal of the first transistor;
said second quiescent current setting element including a second resistor that is directly electrically connected between the control terminal and the second terminal of the second transistor said output power terminal being electrically connected to said connection between said second terminal of said first transistor and said first terminal of said second transistor;
wherein the proportion of current provided to the first and second outputs in a quiescent state eliminates crossover distortion in the power amplified output signal.

25. The operational amplifier of claim 24, wherein the gain stage includes:
a third transistor having a first terminal that is connected to the first output, a second terminal that is connected to the second output, and a control terminal to receive the differential output signal.

26. An operational amplifier comprising:
a differential input stage to receive a first input signal and a second input signal and provide a differential output signal representing a difference between the first and second input signals;
a current source stage to provide a current having a steady value;
a gain stage, coupled to the current source stage and the differential input stage, to receive the current and adjust a proportion of the current that is provided to a first output and a second output based upon the differential output signal; and
a power output stage, coupled to the current source stage and the gain stage, to receive the proportion of current provided to the first and second outputs and generate a power amplified output signal based on the proportion of current provided to the first and second outputs;
wherein the proportion of current provided to the first and second outputs in a quiescent state eliminates crossover distortion in the power amplified output signal;
wherein the power output stage includes:
a first transistor having a first terminal that is connected to a first reference potential terminal, a second terminal that is connected to a power output terminal that provides the power amplified output signal, and a control terminal that is connected to the first output;
a second transistor having a first terminal that is connected to a second reference potential terminal, and a control terminal that is connected to the second output;
a first resistor that is connected between the control terminal and the second terminal of the first transistor; and
a second transistor that is connected between the control terminal and the second terminal of the second transistor; and
wherein the current source stage includes
a third transistor having a first terminal, a second terminal that is electrically coupled to the second reference potential terminal, and a control terminal;
a current source electrically coupled between the first reference potential terminal and the first terminal of the third transistor;
a third resistor that electrically couples the control terminal of the third transistor to the second reference potential terminal;
a fourth transistor having a first terminal, a second terminal that is electrically coupled to the control terminal of the third transistor and a control terminal that is electrically coupled to the first terminal of the third transistor; and
a current mirror, electrically coupled between the first reference potential terminal and the first terminal of the fourth transistor, an output of the current mirror being connected to the first output.

27. The operational amplifier of claim 24, wherein the power output stage includes:
 a third transistor having a first terminal that is connected to the second terminal of the first transistor, a second terminal that is connected terminal that is connected to the second reference potential terminal, and a control terminal;
 a fourth transistor having a first terminal that is connected to the second terminal of the first transistor, a second terminal that is connected to the control terminal of the third transistor, and a control terminal that is connected to the second output;
 a fifth transistor having a first terminal, a second terminal that is electrically coupled to the control terminal of the fourth transistor and a control terminal that is electrically coupled to the first terminal of the fourth transistor; and
 a current mirror, electrically coupled between the first reference potential terminal and the first terminal of the fifth transistor, an output of the current mirror being connected to the first output terminal of the input stage.

28. A power stage of an operational amplifier, comprising:
 a signal input to receive a difference signal indicative of a difference between a first signal and a second signal;
 a current source to provide a current having a steady value at a current output;
 a first circuit, coupled to a first reference potential terminal and directly electrically connected to an output terminal of the power stage, to receive a first portion of the current and provide a first output current to the output terminal that is proportional the first portion of the current;
 a second circuit, directly electrically connected to a second reference potential terminal and directly electrically connected to the output terminal of the power stage, to receive a second portion of the current and pull a second output current from the output terminal that is proportional to the second portion of the current; and
 resistance means, coupled to the current output, the signal input, and the first and second circuits, for adjusting the first and second portions of the current based upon the difference signal and for eliminating crossover distortion at the output terminal.

29. The power stage of claim 28, wherein the resistance means equalizes the first and second portions of the current in a quiescent state.

30. The power stage of claim 28, wherein the resistance means includes variable resistance means, coupled to the current output, the signal input, and the first and second circuits, for increasing the first portion of the current and correspondingly decreasing the second portion of the current in response to an decrease in the difference signal, and increasing the second portion of the current and correspondingly decreasing the first portion of the current in response to an increase in the difference signal.

31. The power stage of claim 30, wherein the first circuit receives the first portion of the current at a first input and the second circuit receives the second portion of the current at a second input, and the resistance means further includes:
 fixed resistance means, respectively coupled between the first input and the output terminal and between the second input and the second reference potential terminal, for establishing a value of both the first output current and the second output current in a quiescent state.

32. The power stage of claim 28, wherein the first circuit receives the first portion of the current at a first input and the second circuit receives the second portion of the current at a second input, and the resistance means includes:
 fixed resistance means, respectively coupled between the first input and the output terminal and between the second input and the second reference potential terminal, for establishing a value of both the first output current and the second output current in a quiescent state.

33. A power stage for an operational amplifier comprising:
 an input stage having an input terminal to receive a differential input signal, a first output terminal, and a second output terminal; and
 a power output stage having a power output terminal and including first and second resistors and first and second transistors, the first and second transistors each having a first terminal, a second terminal, and a control terminal, the control terminal of the first and second transistors being electrically coupled to the first and second output terminals of the input stage, respectively;
 wherein the first terminal of the first transistor is electrically coupled to a first reference potential terminal, and the control terminal of the first transistor is electrically coupled to the second terminal of the first transistor through the first resistor;
 wherein the first terminal of the second transistor is electrically coupled to the second terminal of the first transistor, the second terminal of the second transistor is electrically coupled to a second reference potential terminal, and the control terminal of the second transistor is electrically coupled to the second terminal of the second transistor through the second resistor; and
 wherein said power output terminal is electrically connected to the connection between the second terminal of the first transistor and the first terminal of the second transistor;
 wherein the input stage further includes a current source stage that is connected to the first output terminal of the input stage, the current source stage including;
 a fourth transistor having a first terminal, a second terminal that is electrically coupled to the second reference potential terminal, and a control terminal;
 a current source electrically coupled between the first reference potential terminal and the first terminal of the fourth transistor;
 a third resistor that electrically couples the control terminal of the fourth transistor to the second reference potential terminal;
 a fifth transistor having a first terminal, a second terminal that is electrically coupled to the control terminal of the fourth transistor and a control terminal that is electrically coupled to the first terminal of the fourth transistor; and
 a current mirror, electrically coupled between the first reference potential terminal and the first terminal of the fifth transistor, an output of the current mirror being connected to the first output terminal of the input stage.

* * * * *